(12) United States Patent
Yamanaka (10) Patent No.: US 8,779,399 B2
(45) Date of Patent: Jul. 15, 2014

(54) ELECTROSTATIC DEFLECTOR, LITHOGRAPHY APPARATUS, AND METHOD OF MANUFACTURING DEVICE

(71) Applicant: Canon Kabushiki Kaisha, Tokyo (JP)

(72) Inventor: Toshiro Yamanaka, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/921,287

(22) Filed: Jun. 19, 2013

(65) Prior Publication Data

US 2013/0344700 A1 Dec. 26, 2013

(30) Foreign Application Priority Data

Jun. 22, 2012 (JP) ................................. 2012-141465

(51) Int. Cl.
*H01J 37/147* (2006.01)

(52) U.S. Cl.
USPC .............. 250/492.3; 250/492.22; 250/492.21; 250/396 R; 438/506; 438/505

(58) Field of Classification Search
USPC .......... 250/306, 307, 309–311, 396 R, 492.1, 250/492.2, 492.21, 492.22, 492.3, 526; 438/407, 418, 419, 423, 433, 440, 451, 438/495, 505, 506, 514, 659, 712, 914

See application file for complete search history.

(56) References Cited

U.S. PATENT DOCUMENTS

| | | | | |
|---|---|---|---|---|
| 5,028,795 A | * | 7/1991 | Sakurada et al. | ........... 250/492.2 |
| 5,838,112 A | * | 11/1998 | Tsukakoshi et al. | ..... 315/111.81 |
| 2004/0231150 A1 | | 11/2004 | Charles, Jr. et al. | |
| 2012/0145915 A1 | * | 6/2012 | Van Veen et al. | ......... 250/396 R |
| 2013/0164684 A1 | * | 6/2013 | Yamanaka | .................... 430/296 |

FOREIGN PATENT DOCUMENTS

WO 2010-125526 A1 11/2010

* cited by examiner

*Primary Examiner* — Bernard E Souw
(74) *Attorney, Agent, or Firm* — Rossi, Kimms & McDowell LLP (57) ABSTRACT

The present invention provides an electrostatic deflector which deflects a plurality of charged particle beams, the deflector comprising a first electrode member including a plurality of first electrode pairs arranged along a first axis direction in an oblique coordinate system, and a second electrode member including a plurality of second electrode pairs arranged along a second axis direction in the oblique coordinate system, wherein each of the plurality of charged particle beams is deflected by a corresponding first electrode pair of the plurality of first electrode pairs, and a corresponding second electrode pair of the plurality of second electrode pairs.

7 Claims, 10 Drawing Sheets

FIG. 10B

ELECTROSTATIC DEFLECTOR, LITHOGRAPHY APPARATUS, AND METHOD OF MANUFACTURING DEVICE

BACKGROUND OF THE INVENTION

1. Field of the Invention

The present invention relates to an electrostatic deflector, a lithography apparatus, and a method of manufacturing a device.

2. Description of the Related Art

With miniaturization and large-scale integration of circuit patterns in semiconductor integrated circuits, a lithography apparatus (for example, writing apparatus) which writes a pattern on a substrate with a plurality of charged particle beams (electron beams) is attracting a great deal of attention. Such a lithography apparatus includes an electrostatic deflector which deflects a plurality of charged particle beams, and is used to guide a plurality of charged particle beams to target positions on a substrate. The electrostatic deflector has a structure which sandwiches the charged particle beams using a pair of electrodes (electrode pair), and applies an electric potential difference to the electrode pair to generate an electric field between the pair of electrodes, thereby deflecting the charged particle beams.

A lithography apparatus is required to attain an overlay accuracy or precision on the order of several nanometers or less. To meet this requirement, an electrostatic deflector for guiding each charged particle beam to a target position on a substrate is necessary. An electrostatic deflector including an electrode pair located to sandwich charged particle beams, aligned in a line, of a plurality of charged particle beams has been proposed in each of International Publication No. 2010/125526 Pamphlet, and United States Patent Application Publication No. 2004/0231150.

In recent years, not only the overlay accuracy but also the throughput indicating the productivity is required to improve. Hence, a lithography apparatus improves the throughput by locating a plurality of charged particle beams at a high density. However, when a plurality of charged particle beams are located at a high density, their interval becomes narrow, thus making it difficult to locate an electrode pair to sandwich the charged particle beams.

SUMMARY OF THE INVENTION

The present invention provides, for example, a technique advantageous in deflection of a plurality of charged particle beams.

According to one aspect of the present invention, there is provided an electrostatic deflector which deflects a plurality of charged particle beams, the deflector comprising: a first electrode member including a plurality of first electrode pairs arranged along a first axis direction in an oblique coordinate system; and a second electrode member including a plurality of second electrode pairs arranged along a second axis direction in the oblique coordinate system, wherein each of the plurality of charged particle beams is deflected by a corresponding first electrode pair of the plurality of first electrode pairs, and a corresponding second electrode pair of the plurality of second electrode pairs.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

First Embodiment

Figure 1:
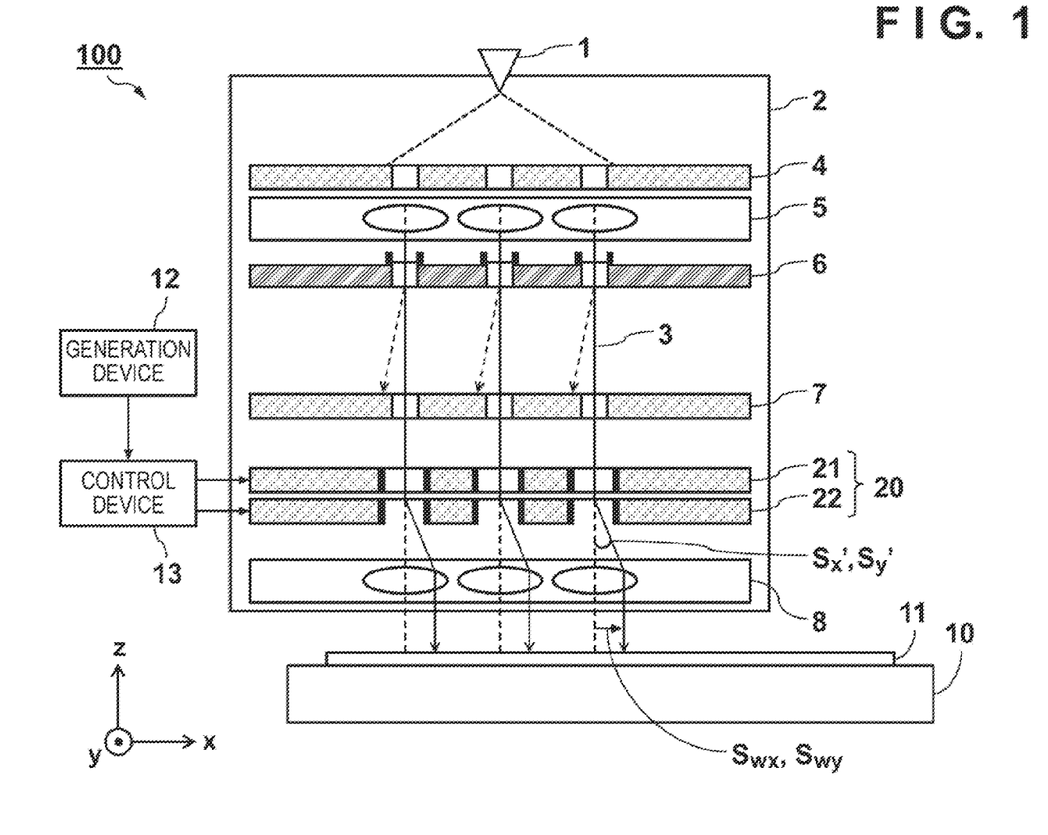
FIG. 1 is a view showing the configuration of a lithography apparatus according to the first embodiment.

A lithography apparatus 100 according to the first embodiment of the present invention will be described with reference to FIG. 1. The lithography apparatus 100 according to the first embodiment includes a charged particle gun 1, writing device 2, and substrate stage 10, and irradiates a substrate 11 with charged particle beams 3 to write a pattern. The writing device 2 includes, for example, an aperture array 4, first electrostatic lens 5, blanking deflector 6, blanking apertures 7, electrostatic deflector 20, and second electrostatic lens 8. The lithography apparatus 100 also includes a generation device 12 which generates a command value (desired value) to control the electrostatic deflector 20, and a control device 13 which controls the electrostatic deflector 20 based on the command value generated by the generation device 12.

A charged particle beam emitted by the charged particle gun 1 is incident on the aperture array 4 having a plurality of apertures arranged in a matrix, and is split into a plurality of charged particle beams 3. The charged particle beams 3 split by the aperture array 4 are incident on the first electrostatic lens 5. The charged particle beams 3 having passed through the first electrostatic lens 5 pass through the blanking deflector 6 for individually controlling the blanking of the plurality of charged particle beams 3. The blanking deflector 6 has a function of deflecting a charged particle beam, and charged particle beams 3 deflected by the blanking deflector 6 are blocked by the blanking apertures 7 and do not reach the surface of the substrate 11. That is, the blanking deflector 6 switches between ON and OFF of the irradiation of the substrate 11 with the charged particle beams 3. Charged particle beams 3 having passed through the blanking apertures 7 are irradiated on the substrate 11, held on the substrate stage 10, through the electrostatic deflector 20 for scanning the charged particle beams 3 on the substrate 11, and the second electrostatic lens 8.

Figure 10A:
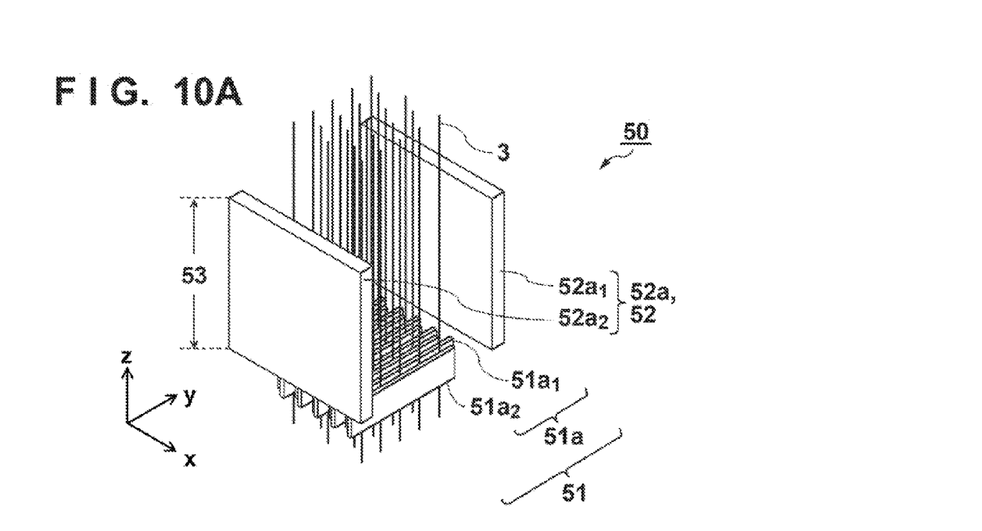
FIG. 10A is a perspective view showing the conventional electrostatic deflector.
Figure 10B:
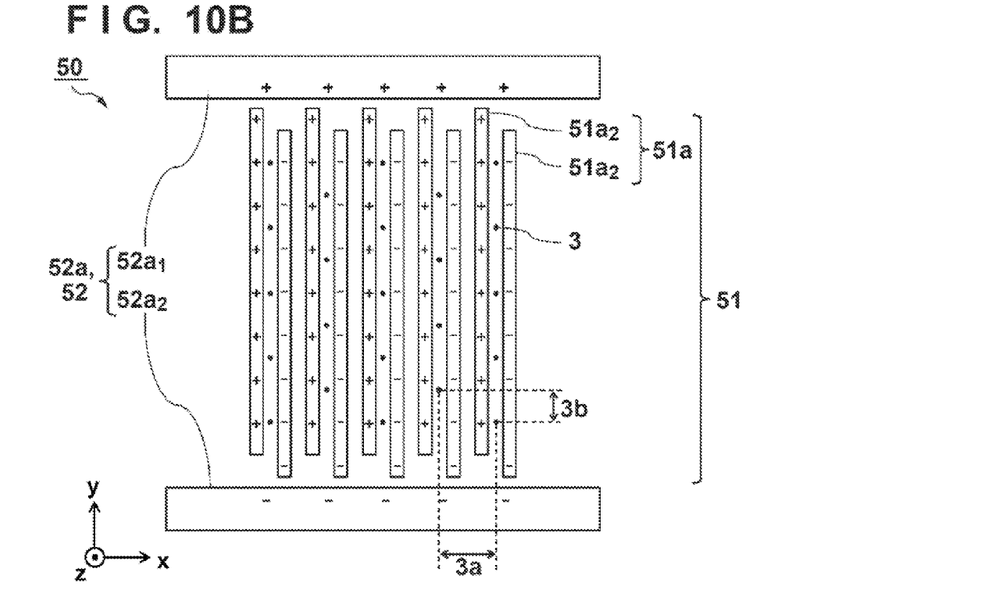
FIG. 10B is a view showing the conventional electrostatic deflector as viewed from the Z-direction.

A conventional electrostatic deflector 50 will be described herein. FIGS. 10A and 10B are views showing the conventional electrostatic deflector 50, in which FIG. 10A is a perspective view of the conventional electrostatic deflector 50; and FIG. 10B is a view of the conventional electrostatic deflector 50 as viewed from the Z-direction (the traveling direction of the charged particle beams 3). To guide each charged particle beam 3 to a target position on the substrate 11 with high accuracy, the conventional electrostatic deflector 50 includes electrode members 51 and 52 which deflect each charged particle beam 3 in respective directions (X- and Y-directions) perpendicular to the surface of the substrate 11, as shown in FIG. 10A. The electrode member 51 which deflects the charged particle beams in the X-direction includes a plurality of electrode pairs 51a. Each electrode pair 51a is formed by a pair of electrodes $51a_1$ and $51a_2$ which sandwich charged particle beams 3, aligned in a line in the Y-direction, of a plurality of charged particle beams 3, as shown in FIG. 10B. The thus configured electrode pairs 51a are provided in a number corresponding to the number of lines, aligned in the Y-direction, of the plurality of charged particle beams 3, and the charged particle beams 3 sandwiched between the electrode pairs 51a are deflected in the X-direction by applying an electric potential difference between the pairs of electrodes $51a_1$ and $51a_2$. On the other hand, the electrode member 52 which deflects the charged particle beams 3 in the Y-direction is formed by one electrode pair 52a. The electrode pair 52a is formed by a pair of electrodes $52a_1$ and $52a_2$ which sandwich the plurality of charged particle beams 3, and the plurality of charged particle beams 3 are collectively deflected in the Y-direction by generating an electric potential difference between the pair of electrodes $52a_1$ and $52a_2$. The electrode pair 52a is located in this way because the plurality of charged particle beams 3 are located at a high density, so a gap 3b in the Y-direction is narrower than a gap 3a in the X-direction, thus making it difficult to locate electrodes as in the electrode pairs 51a. However, when the electrode pair 52a which deflects the charged particle beams 3 in the Y-direction is located, as shown in FIGS. 10A and 10B, an electric field applied to each charged particle beam 3 becomes nonuniform, leading to variations in the deflection angle of this charged particle beam 3. However, when a height 53 of the electrode pair 52a which deflects each charged particle beam 3 in the Y-direction to apply a uniform electric field to this charged particle beam 3 is increased, the distance across which this charged particle beam 3 passes through the electrode pair 52a increases. This prolongs the settling time in deflecting each charged particle beam, and therefore lowers the high-speed performance. To prevent this, the electrostatic deflector 20 of the first embodiment includes a first electrode member 21 and second electrode member 22 located to obliquely intersect with each other, based on the arrangement of the plurality of charged particle beams 3.

Figure 2:
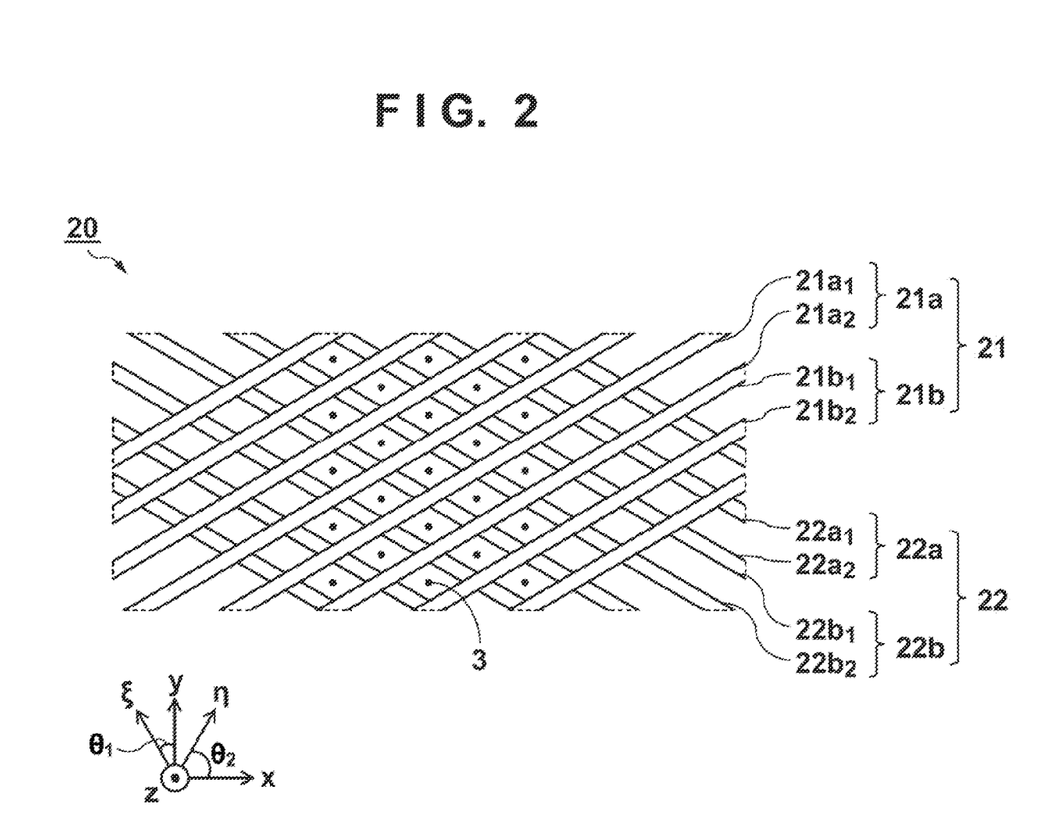
FIG. 2 is a view showing an electrostatic deflector of the first embodiment as viewed from the Z-direction.
Figure 3:
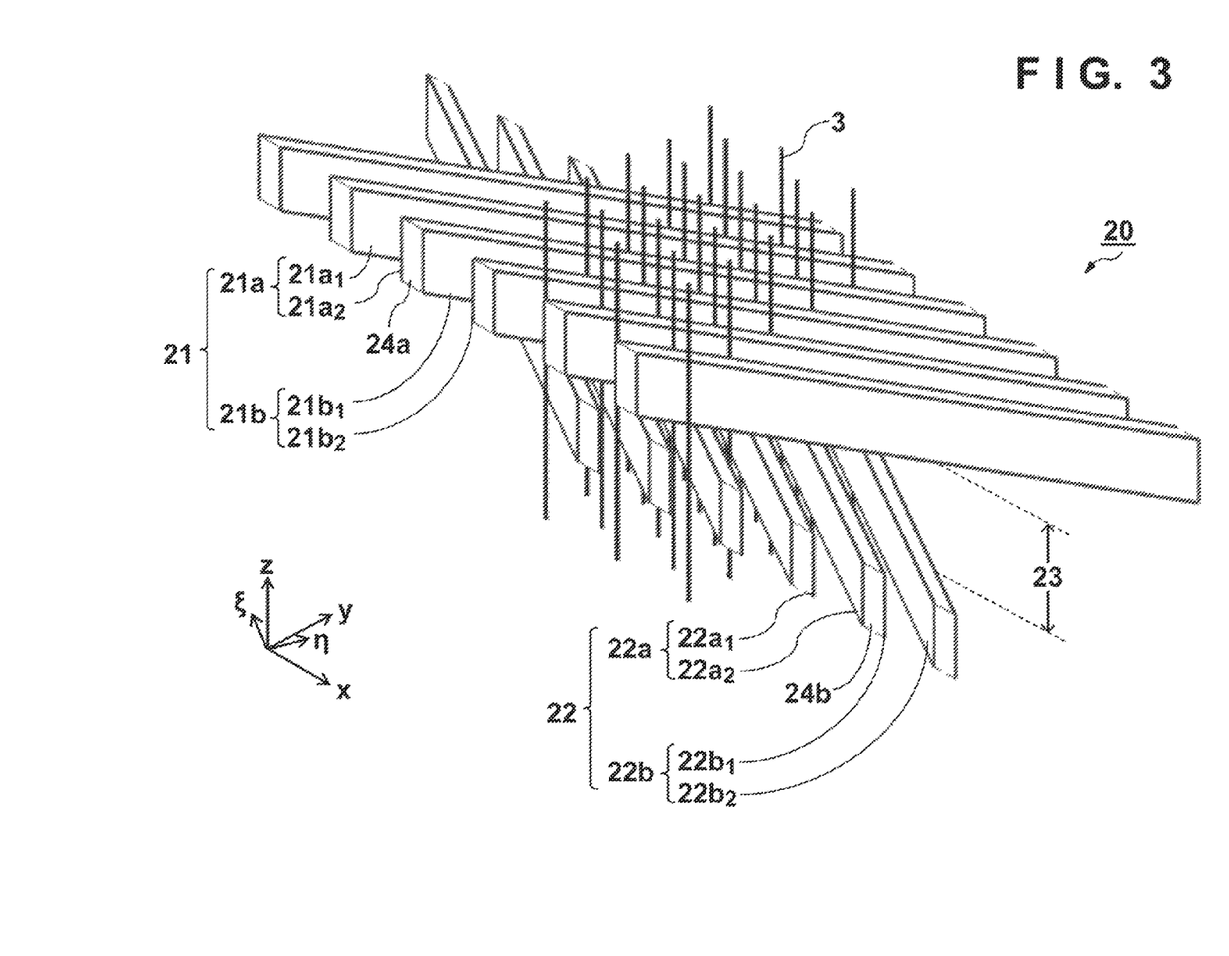
FIG. 3 is a perspective view showing the electrostatic deflector of the first embodiment.

The electrostatic deflector 20 of the first embodiment will be described with reference to FIGS. 2 and 3. FIG. 2 is a view showing the electrostatic deflector 20 of the first embodiment as viewed from the Z-direction (the traveling direction of the charged particle beams), and FIG. 3 is a perspective view showing the electrostatic deflector 20 of the first embodiment. The electrostatic deflector 20 of the first embodiment includes a first electrode member 21 and second electrode member 22 located to obliquely intersect with each other in an oblique coordinate system (nonorthogonal coordinate system), as shown in FIG. 2. With this arrangement, the first electrode member 21 and second electrode member 22 are located to obliquely intersect with each other so as to locate both first and second electrode pairs in the gaps between the plurality of charged particle beams 3 located at a high density. The first electrode member 21 includes a plurality of first electrode pairs 21a, 21b, . . . arranged along the ξ-direction (first axis direction). The first electrode pair 21a includes, for example, a pair of electrodes $21a_1$ and $21a_2$ extending in a direction perpendicular to the ξ-direction in the oblique coordinate system. Also, the second electrode member 22 includes a plurality of second electrode pairs 22a, 22b, . . . arranged along the η-direction (second axis direction) in the oblique coordinate system. The second electrode pair 22a includes, for example, a pair of electrodes $22a_1$ and $22a_2$ extending in a direction perpendicular to the η-direction in the oblique coordinate system. In the first embodiment, the ξ- and η-directions in an oblique coordinate system mean a direction which makes an angle $θ_1$ of 30° with the Y-direction in an orthogonal coordinate system, and a direction which makes an angle $θ_2$ of 60° with the X-direction in the orthogonal coordinate system, respectively. The thus configured first electrode member 21 and second electrode member 22 are spaced apart from each other in the Z-direction at an interval 23 across which they can be insulated electrically, as shown in FIG. 3. A supporting member 24a which supports a plurality of first electrode pairs is located between two adjacent first electrode pairs (for example, between the first electrode pairs 21a and 21b) of the plurality of first electrode pairs 21. Similarly, a supporting member 24b which supports a plurality of second electrode pairs is located between two adjacent second electrode pairs (for example, between the second electrode pairs 22a and 22b) of the plurality of second electrode pairs 22. The supporting members 24a and 24b are formed by members with high insulation property, and the supporting member 24a has electrodes $21a_2$ and $21b_1$ formed on its side surface, while the supporting member 24b has electrodes $22a_2$ and $22b_1$ formed on its side surface. With this arrangement, in the electrostatic deflector 20 of the first embodiment, the first electrode member 21 and second electrode member 22 are located to obliquely intersect with each other so as to locate both of them in the gaps between the plurality of charged particle beams 3. Hence, the interval between the pair of electrodes $21a_1$ and $21a_2$ in the first electrode pair 21a, and that between the pair of electrodes $22a_1$ and $22a_2$ in the second electrode pair 22a can be set narrower than those in the conventional electrostatic deflector 50 to apply a uniform electric field to each charged particle beam 3. That is, the deflection angles of the plurality of charged particle beams 3 can be controlled with high accuracy without raising the height 53 of the electrode pair 52a, unlike the conventional electrostatic deflector 50. Note that in the electrostatic deflector 20 of the first embodiment, the interval between the plurality of charged particle beams is 150 μm, the heights of both the first and second electrode pairs are 200 μm, the interval 23 between the first and second electrode pairs is 50 μm, the distance between a pair of electrodes is 90 μm, and the distance between adjacent electrode pairs is 40 μm. Also, an electrostatic shield which suppresses a fringe electric field may be located at the top of a plurality of first electrode pairs, between the plurality of first electrode pairs and a plurality of second electrode pairs, or at the bottom of the plurality of second electrode pairs.

Figure 4:
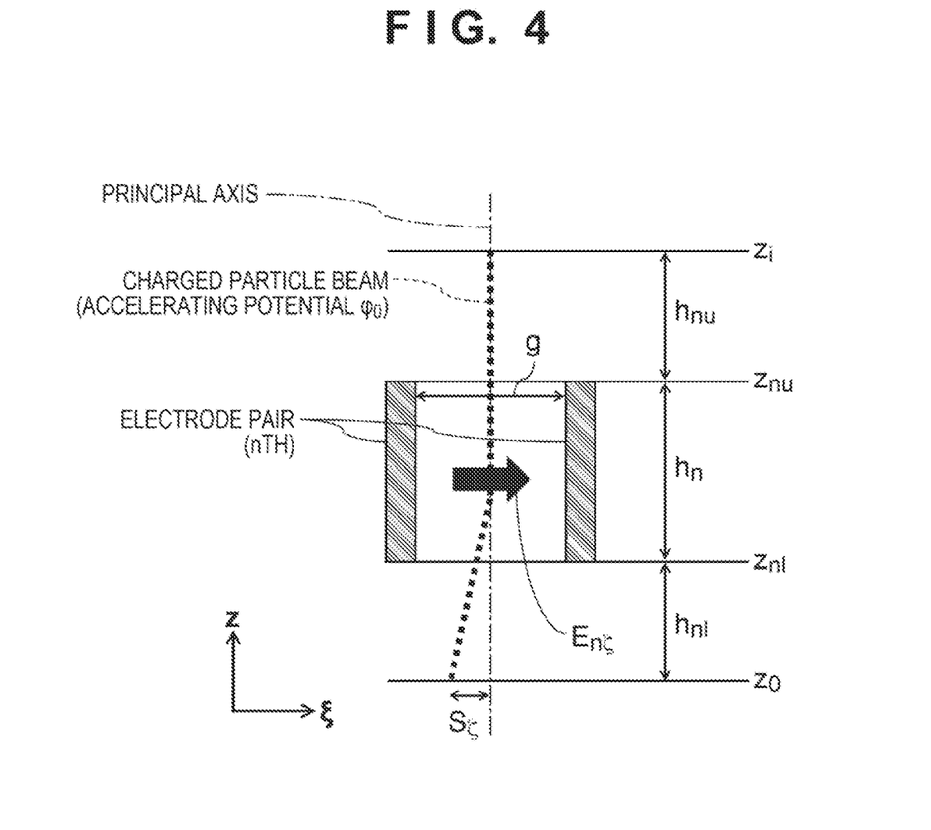
FIG. 4 is a view showing the setting conditions of parameters in a deflection electric field corresponding to one charged particle beam.

A response effect of the deflection angle to the height of the electrode pair (Z-dimension) will be quantitatively described herein in accordance with a physical model. FIG. 4 shows one charged particle beam, and the setting conditions of parameters in a deflection electric field corresponding to it. FIG. 4 shows the nth electrode pair, from the upstream side in the traveling direction of charged particles (−Z-direction), of a plurality of electrode pairs aligned in the traveling direction of charged particles (−Z-direction). Note that $z_0$ is the Z-position at the top of the (n+1)th electrode pair, $z_{nl}$ is the Z-position at the bottom of the nth electrode pair, $z_{nu}$ is the Z-position at the top of the nth electrode pair, and $z_i$ is the Z-position at the bottom of the (n−1)th electrode pair. Also, $h_{nl}$ is the distance between the (n+1)th electrode pair and the nth electrode pair (the difference between $z_0$ and $z_{nl}$), $h_n$ is the height of the electrode pair (the difference between $z_{nl}$ and $z_{nu}$), and $h_{nu}$ is the distance between the nth electrode pair and the (n−1)th electrode pair (the difference between $z_{nu}$ and $z_i$). Note that FIG. 4 shows only an electrode pair extending in a direction perpendicular to the ξ-direction for the sake of simplicity. Also, although a charged particle beam is constituted by a plurality of charged particles, the Coulomb effect produced by the interaction of the plurality of charged particles is assumed to be negligible, and a fringe electric field generated at the end of the electrode pair in the Z-direction is also assumed to be negligible.

A velocity $V_z$ of a charged particle in its traveling direction (−Z-direction) is given by:

$$V_z = \frac{dz}{dt} = -\sqrt{\frac{2e\phi_0}{m}} \quad (1)$$

where m is the mass of the charged particle, e is the charge, and $\phi_0$ is the accelerating potential (accelerating voltage). Also, a deflection angle $S_\xi'$ of the charged particle is given by:

$$S_\xi'(z,t) = \frac{\partial S_\xi}{\partial z} \quad (2)$$

where $S_\xi$ is the amount of deflection of the charged particle in the ξ-direction from the principal axis, and $V_\xi$ is its velocity. Assume that the velocity $V_z$ is sufficiently lower than the light velocity, so the relativistic effect is negligible.

Assuming that the velocity $V_\xi$ and amount of deflection $S_\xi$ of the charged particle continuously change upon changes in position z and time t, fundamental equations of the velocity $V_\xi$ and amount of deflection $S_\xi$ of the charged particle are given from an equation of motion of the charged particle as:

$$\begin{cases} \frac{dV_\xi(z,t)}{dt} = \frac{\partial V_\xi(z,t)}{\partial z}V_z + \frac{\partial V_\xi(z,t)}{\partial t} = -\frac{V_z^2}{2\phi_0}E_{n\gamma}(z,t) \\ \frac{dS_\xi(z,t)}{dt} = \frac{\partial S_\xi(z,t)}{\partial z}V_z + \frac{\partial S_\xi(z,t)}{\partial t} = V_\xi(z,t) \end{cases} \quad (3)$$

Also, $E_{n\xi}$ is a uniform electric field generated in the ξ-direction for the nth electrode pair from the upstream side in the traveling direction of charged particles (−Z-direction), and is given by:

$$E_{n\xi}(z,t) = \{U_s(z-z_{nl}) - U_s(z-z_{nu})\} \cdot E_{n\xi}(t), \; U_s(z) = \begin{cases} 0 & \dots z<0 \\ 1 & \dots z \geq 0 \end{cases} \quad (4)$$

From the foregoing, we have a function describing the amount of deflection $S_\xi$ as:

$$\left(V_z^2 \frac{\partial^2}{\partial z^2} + 2V_z \frac{\partial^2}{\partial z \partial t} + \frac{\partial^2}{\partial t^2}\right) \cdot S_\xi(z,t) = \\ -\frac{V_z^2}{2\phi_0}\{U_s(z-z_{nl}) - U_s(z-z_{nu})\} \cdot E_{n\xi}(t) \quad (5)$$

When the Laplace transform ((z,t)→(p,s)) of the amount of deflection $S_\xi(z,t)$ as a function of the position z and time t is calculated, we have a function describing the amount of deflection $S_\xi$ as:

$$S_\xi(p,s) = \quad (6) \\ \frac{V_z^2}{2\phi_0 s^2}\left\{\frac{V_z^{-1}s}{(p+V_z^{-1}s)^2} + \frac{1}{p+V_z^{-1}s} - \frac{1}{p}\right\}(e^{-z_{nl}p} - e^{-z_{nu}p}) \cdot E_{n\xi}(s)$$

Also, when the inverse Laplace transform (p→z) of equation (6) is calculated only for the position z, we have:

$$S_\xi(z,s) = \quad (7) \\ \frac{V_z^2}{2\phi_0 s^2}\left\{\left(\frac{z-z_{nl}}{V_z}s + 1\right) \cdot e^{-\frac{z-z_{nl}}{V_z}s} - \left(\frac{z-z_{nu}}{V_z}s + 1\right) \cdot e^{-\frac{z-z_{nu}}{V_z}s}\right\} \cdot E_{n\xi}(s)$$

When equation (7) is further partially differentiated with respect to the position z, a transfer function $G_n$ from the electric field $E_{n\xi}$ to the deflection angle $S_\xi'$ is given by:

$$G_n(z,s) := \frac{S_\xi'(z,s)}{E_{n\xi}(s)} = \frac{1}{2\phi_0}\left\{(z-z_{nl}) \cdot e^{-\frac{z-z_{nl}}{V_z}s} - (z-z_{nu}) \cdot e^{-\frac{z-z_{nu}}{V_z}s}\right\} \quad (8)$$

Note that easiest control for attaining a target deflection angle $S_{\xi d}'$ is proportional control. More specifically, in such proportional control, an electric field $E_{n\xi d}$ given by:

$$E_{n\xi d} = G_n^{-1}(z,0) \cdot S_{\xi d}', \; G_n(z,0) = \frac{z_{nu} - z_{nl}}{2\phi_0} \quad (9)$$

is generated. At this time, a normalized deviation Δ obtained by normalizing the deflection angle $S_\xi'$ using the target deflection angle $S_{\xi d}'$ is given by:

$$\Delta(s) := \frac{S_\xi'(z,s) - S_{\xi d}'}{S_{\xi d}'} \quad (10) \\ = G_n(z,s) \cdot G_n^{-1}(z,0) - 1 \\ = -\frac{z - z_{nl}}{z_{nu} - z_{nl}} \cdot \left(1 - e^{-\frac{z-z_{nl}}{V_z}s}\right) + \\ \frac{z - z_{nu}}{z_{nu} - z_{nl}} \cdot \left(1 - e^{-\frac{z-z_{nu}}{V_z}s}\right)$$

Also, assuming z=0, $z_{nl}=h_{nl}$, and $z_{nu}=h_n+h_{nl}$ for the sake of further simplicity, equation (10) is rewritten as:

$$\Delta(s) = \frac{h_{nl}}{h_n} \cdot \left(1 - e^{-\frac{h_{nl}}{|V_z|}s}\right) - \left(1 + \frac{h_{nl}}{h_n}\right) \cdot \left(1 - e^{-\frac{h_n + h_{nl}}{|V_z|}s}\right) \quad (11)$$

The absolute value $|\Delta(j \cdot 2\pi f)|$ of the frequency response of the deviation to a control frequency f of the electric field $E_{n\xi}$ can be calculated using the normalized deviation $\Delta$ represented by equation (11). Also, since the deflection angle $S_\xi'$ is proportionally transformed into an amount of deflection $S_{w\xi}$ on the substrate surface, the normalized deviation $\Delta$ is equivalent to the amount of deflection $S_{w\xi}$ on the substrate surface.

Figure 5:
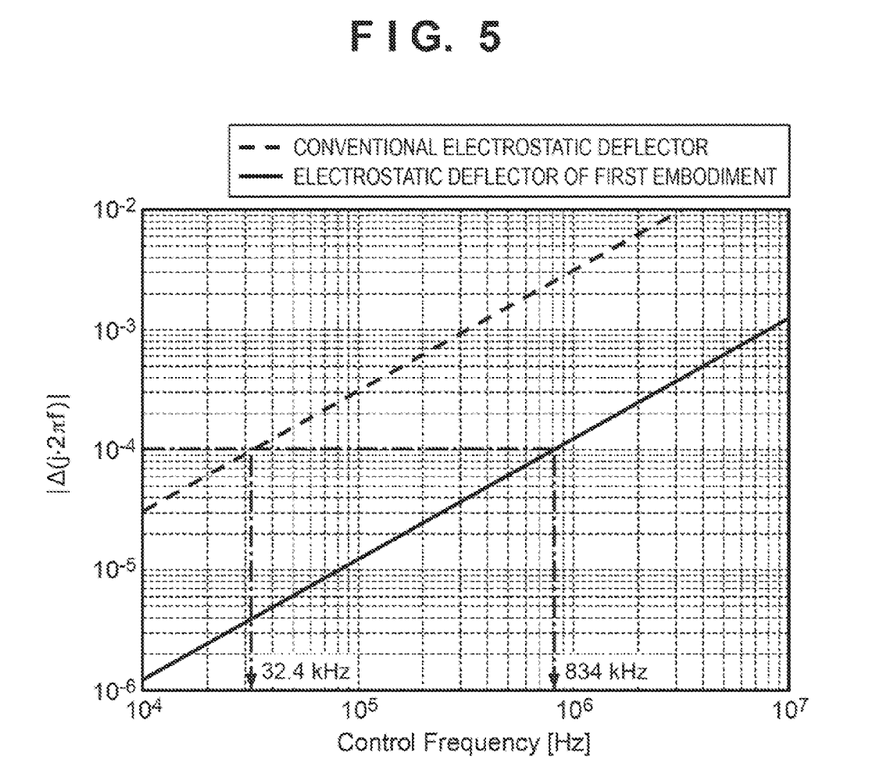
FIG. 5 is a graph showing the frequency characteristics of the absolute value of a normalized deviation.

The frequency characteristics of the normalized deviation absolute value $|\Delta(j \cdot 2\pi f)|$ in the electrostatic deflector 20 of the first embodiment and the conventional electrostatic deflector 50 will be compared with each other herein. This comparison will be done upon focusing attention especially on an electrostatic deflector (corresponding to the first electrode pair 21a in the electrostatic deflector 20 of the first embodiment, and the electrode pair 52a in the conventional electrostatic deflector 50) on the upstream side in the traveling direction (−Z-direction) of the charged particle beams. FIG. 5 is a graph showing the frequency characteristics of the absolute values of the normalized deviations in the electrostatic deflector 20 of the first embodiment, and the conventional electrostatic deflector 50. FIG. 5 shows the control frequency f on the abscissa, and the absolute value $|\Delta(j \cdot 2\pi f)|$ of the normalized deviation on the ordinate. In calculating the normalized deviation, the physical property value of an electron serving as a charged particle was used, and the accelerating potential $\phi_0$ was 5 kV. Also, the height $h_n$ of the electrode pair was 0.2 mm in the electrostatic deflector 20 of the first embodiment, and 20 mm in the conventional electrostatic deflector 50. The distance $h_{nl}$ between the upstream electrostatic deflector and the downstream electrostatic deflector (corresponding to the second electrode pair 22a in the electrostatic deflector 20 of the first embodiment, and the electrode pair 51a in the conventional electrostatic deflector 50) was 0.3 mm in both the conventional electrostatic deflector 50 and the electrostatic deflector 20 of the first embodiment.

The absolute value $|\Delta(j \cdot 2\pi f)|$ of the normalized deviation increases with an increase in control frequency f, as shown in FIG. 5. Note that if, for example, the allowable error when the amount of deflection of the charged particle beam on the substrate surface is ±1 μm must fall within ±0.1 nm, the absolute value $|\Delta(j \cdot 2\pi f)|$ of the normalized deviation needs to be $10^{-4}$ or less. At this time, as can be seen from FIG. 5, the upper limit of the control frequency f is 32.4 kHz in the conventional electrostatic deflector 50, and 834 kHz in the electrostatic deflector 20 of the first embodiment. That is, the electrostatic deflector 20 of the first embodiment can increase the upper limit of the control frequency f by 10 or more times that in the conventional electrostatic deflector 50. Such a difference is obtained due mainly to the height $h_n$ of the electrode pair, that is, the time for the charged particle to pass through the electrode pair, and is equal to the settling time in deflecting the charged particle beam. Hence, the electrostatic deflector 20 of the first embodiment need only have electrode pairs 21a and 22a with relatively low heights, and can be positioned at a velocity higher than that in the conventional electrostatic deflector 50.

Second Embodiment

Figure 6:
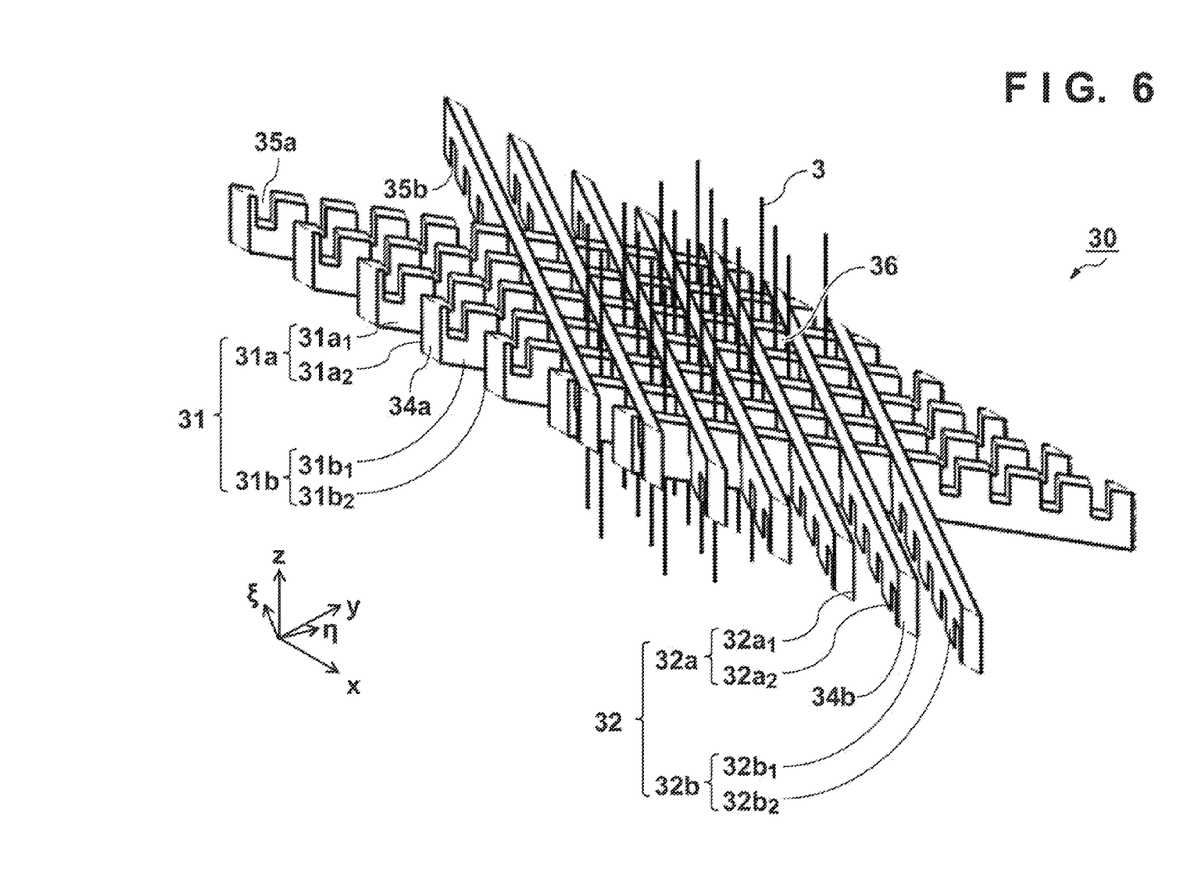
FIG. 6 is a perspective view showing an electrostatic deflector of the second embodiment.

An electrostatic deflector 30 of the second embodiment of the present invention will be described with reference to FIG. 6. The electrostatic deflector 30 of the second embodiment is different from the electrostatic deflector 20 of the first embodiment in that a first electrode member 31 and a second electrode member 32 at least partially overlap each other in the Z-direction. Trenches 35a and 35b are formed in the portions where first electrode pairs 31a, 31b, . . . in the first electrode member 31, and second electrode pairs 32a, 32b, . . . in the second electrode member 32 overlap each other. The trenches 35a formed in the first electrode pairs, and the trenches 35b formed in the second electrode pairs are cut in opposite directions, so that the first electrode member 31 and second electrode member 32 can be arranged at nearly the same position in the Z-direction without contacting each other. Also, in the electrostatic deflector 30 of the second embodiment, a supporting member 34a is located between two adjacent first electrode pairs (for example, between the first electrode pairs 31a and 31b) of a plurality of first electrode pairs, as in the electrostatic deflector 20 of the first embodiment. A supporting member 34b is inserted between two adjacent second electrode pairs (for example, between the second electrode pairs 32a and 32b) of a plurality of second electrode pairs. The supporting members 34a and 34b are formed by members with high insulation property, and the supporting member 34a has electrodes $31a_2$ and $31b_1$ formed on its side surface, while the supporting member 34b has electrodes $32a_2$ and $32b_1$ formed on its side surface.

With the above-mentioned configuration, the electrostatic deflector 30 of the second embodiment can have a height lower than that of the electrostatic deflector 20 of the first embodiment. On the other hand, an electric field generated by the first electrode pair 31 and that generated by the second electrode pair 32 are more likely to interfere with each other in the electrostatic deflector 30 of the second embodiment than in the electrostatic deflector 20 of the first embodiment. In view of this phenomenon, in the electrostatic deflector 30 of the second embodiment, it was verified by electrostatic field FEM (Finite Element Method) analysis whether the charged particle beam can be deflected in an arbitrary direction in an orthogonal coordinate system (on the X-Y plane).

Figure 7:
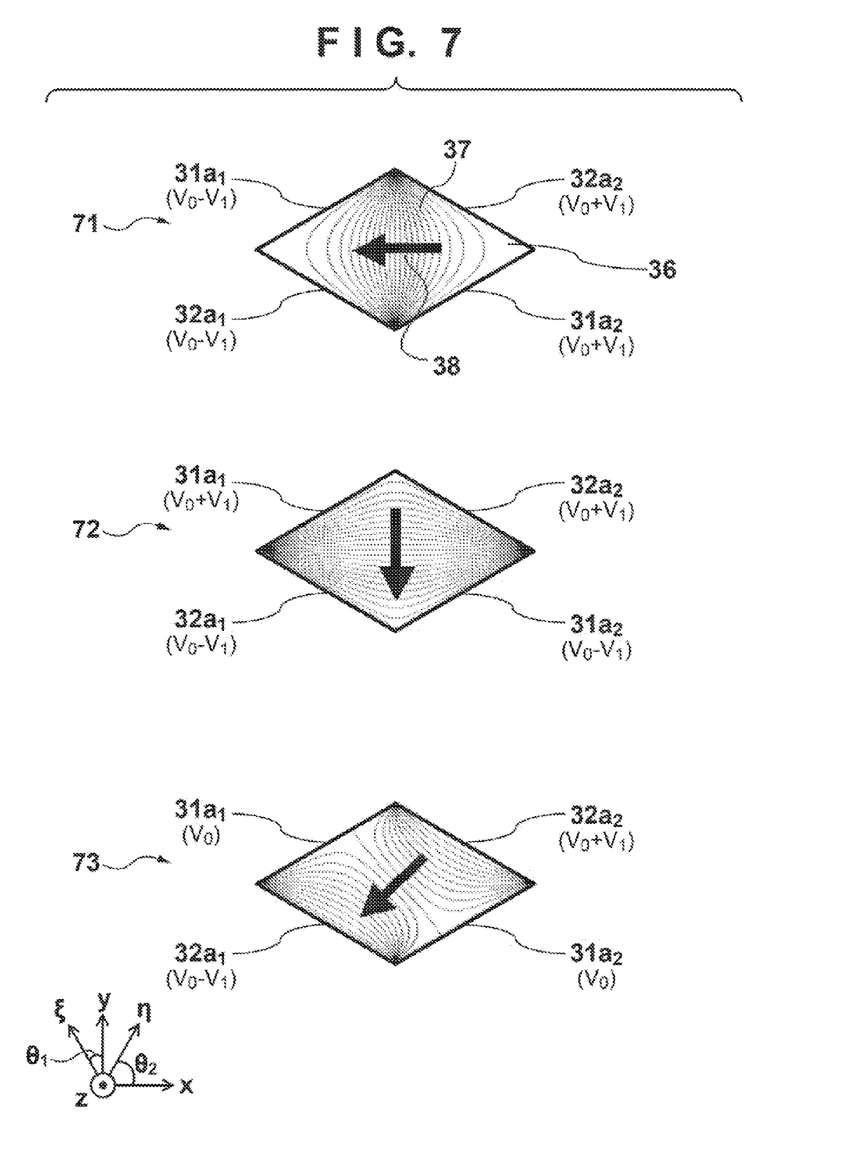
FIG. 7 shows views of the results of electrostatic field FEM analysis in a space corresponding to one charged particle beam.

FIG. 7 shows views of the results of electrostatic field FEM analysis in a space 36 which is defined by the first electrode pair 31a and second electrode pair 32a, and corresponds to one charged particle beam. Referring to FIG. 7, a curve 37 indicates an equipotential surface in an orthogonal coordinate system (on the X-Y plane), and an arrow 38 indicates an electric field vector generated at the position through which the charged particle beam passes. 71 in FIG. 7 shows an electric field vector when an electric potential difference symmetric about the Y-axis is applied to an offset potential $V_0$ and, more specifically, a potential $V_0-V_1$ is applied to electrodes $31a_1$ and $32a_1$, and a potential $V_0+V_1$ is applied to electrodes $31a_2$ and $32a_2$. When a potential is applied to each electrode in this way, the electric field vector is oriented in the −X-direction, so a positively charged particle beam is deflected in the −X-direction, while a negatively charged particle beam is deflected in the +X-direction. 72 in FIG. 7 shows an electric field vector when an electric potential difference symmetric about the X-axis is applied to an offset potential $V_0$ and, more specifically, a potential $V_0-V_1$ is applied to electrodes $31a_2$ and $32a_1$, and a potential $V_0+V_1$ is applied to electrodes $31a_1$ and $32a_2$. When a potential is applied to each electrode in this way, the electric field vector is oriented in the −Y-direction, so a positively charged particle beam is deflected in the −Y-direction, while a negatively charged particle beam is deflected in the +Y-direction. 73 in FIG. 7 shows an electric field vector when electrodes $31a_1$ and $31a_2$ have an offset potential $V_0$, a potential $V_0-V_1$ is applied to an electrode $32a_2$, and a potential $V_0+V_1$ is applied to an electrode $32a_1$. When a potential is applied to each electrode in this way, the charged particle beam can be simultaneously deflected in both the X- and Y-directions. With these arrangements, even if an electric field generated by the first electrode pair 31a, and that generated by the second electrode pair 32a interfere with each other, the charged particle beam can be deflected in an arbitrary direction in an orthogonal coordinate system (on the X-Y plane) by obtaining in advance and adjusting a correlation between the potential applied to each electrode and the electric field vector.

Figure 8:
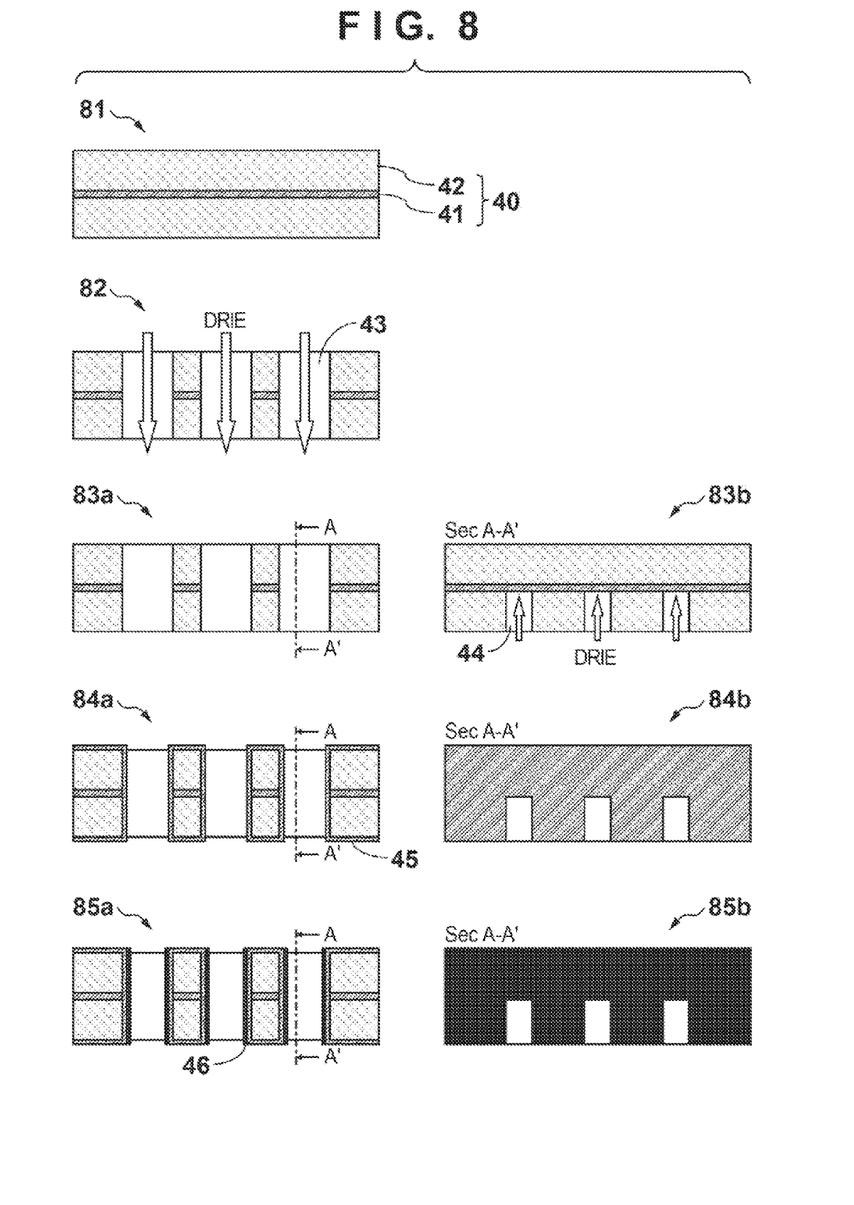
FIG. 8 shows views of a process of manufacturing a first electrode member.

An example of a method of manufacturing a first electrode member 31 will be described herein with reference to FIG. 8. FIG. 8 is a sectional view of a substrate 40, which shows a process of manufacturing a first electrode member 31. In the first electrode member 31, a plurality of first electrode pairs must be periodically manufactured to have a height (Z-dimension) of several hundred micrometers or less. To meet this requirement, it is desired to adopt a method of preparing, for example, a silicon substrate or an SOI (Silicon On Insulator) substrate, and partially etching the substrate 40 to manufacture a first electrode member 31. Etching is desirably done using DRIE (Deep Reactive Ion Etching) to obtain a high aspect ratio and a high verticality. Also, the height of the first electrode member 31 can be controlled by polishing the substrate surface (front/back).

An SOI substrate in which a silicon oxide film ($SiO_2$) is inserted into a single-crystal Si layer 42 as a BOX (Buried Oxide) layer 41, as shown in 81 of FIG. 8, is used as the substrate 40. The substrate 40 is partially masked by, for example, a resist or a metal film, and is etched using DRIE, as shown in 82 of FIG. 8. With this operation, an unmasked portion on the substrate is etched to form a plurality of through-holes 43 at once. Note that in forming through-holes in the BOX layer 41, wet etching may be used in combination, or a process of etching by DRIE from the back surface of the substrate 40 as well may be used in combination. In steps shown in 83a and 83b of FIG. 8, a trench 44 or 33a is formed in the substrate 40, having the through-holes 43 formed in this way, from the back surface of the substrate 40. A portion indicated by a line A-A' in 83a of FIG. 8 is shown in 83b of FIG. 8. In a step shown in 83b of FIG. 8, the single-crystal Si layer 42 between adjacent through-holes 43 is partially masked, and an unmasked portion is etched up to the BOX layer 41. At this time, since the single-crystal Si layer 42 and BOX layer 41 have considerably large etching rates, the BOX layer 41 can be used as an etch stopper. After the trench 44 (33a) is formed, an insulating layer 45 is formed in the surface (including the interior of the through-holes 43) of the substrate 40, as shown in 84a and 84b of FIG. 8. The insulating layer 45 can be formed by, for example, heating the substrate 40 in an oxygen atmosphere so as to convert the single-crystal Si layer 42 into a silicon oxide film ($SiO_2$). Alternatively, the insulating layer 45 can be formed by forming tetraethyl orthosilicate (TEOS) on the surface of the substrate 40, and heating it so as to convert it into a silicon oxide film ($SiO_2$). After the insulating layer 45 is formed, a conductive film 46 is formed on the side walls of the through-holes 43 as electrodes, as shown in 85a and 85b of FIG. 8. The conductive film 46 may be formed by a metal, low-resistance polysilicon, or a stacked structure of a plurality of materials to improve the adhesion strength. With such a manufacturing method, a first electrode member 31 can be manufactured. A second electrode member 32 can be similarly manufactured using such a manufacturing method.

Due to the trenches 35a and 35b, the first electrode member 31 and second electrode member 32 manufactured in this way can be stacked in sequence without contacting each other. An electrostatic deflector 30 of the second embodiment is manufactured by connecting and fixing the stacked first electrode member 31 and second electrode member 32 to each other on the peripheral portion. Note that an electrostatic deflector 20 of the first embodiment can also be manufactured by the same manufacturing processes. In the electrostatic deflector 20 of the first embodiment, trenches need not be formed.

<Embodiment of Control Device>

Control of the electrostatic deflector 20 of the first embodiment will be described with reference to FIG. 9. The electrostatic deflector to be controlled is not limited to the electrostatic deflector 20 of the first embodiment, and may be the electrostatic deflector 30 of the second embodiment, or an electrostatic deflector including a plurality of first electrode pairs and a plurality of second electrode pairs extending in first and second axis directions, respectively, in an oblique coordinate system. The electrostatic deflector 20 includes a generation device 12 and control device 13. The generation device 12 generates command values to apply electric potential differences to the plurality of first electrode pairs and plurality of second electrode pairs, based on the target positions on the substrate. Also, the control device 13 controls the electrostatic deflector 20 based on the command value generated by the generation device 12. The target positions on the substrate surface mean herein the positions on the substrate, on which a plurality of charged particle beams 3 are incident, and are represented by an orthogonal coordinate system (on the X-Y plane).

Figure 9:
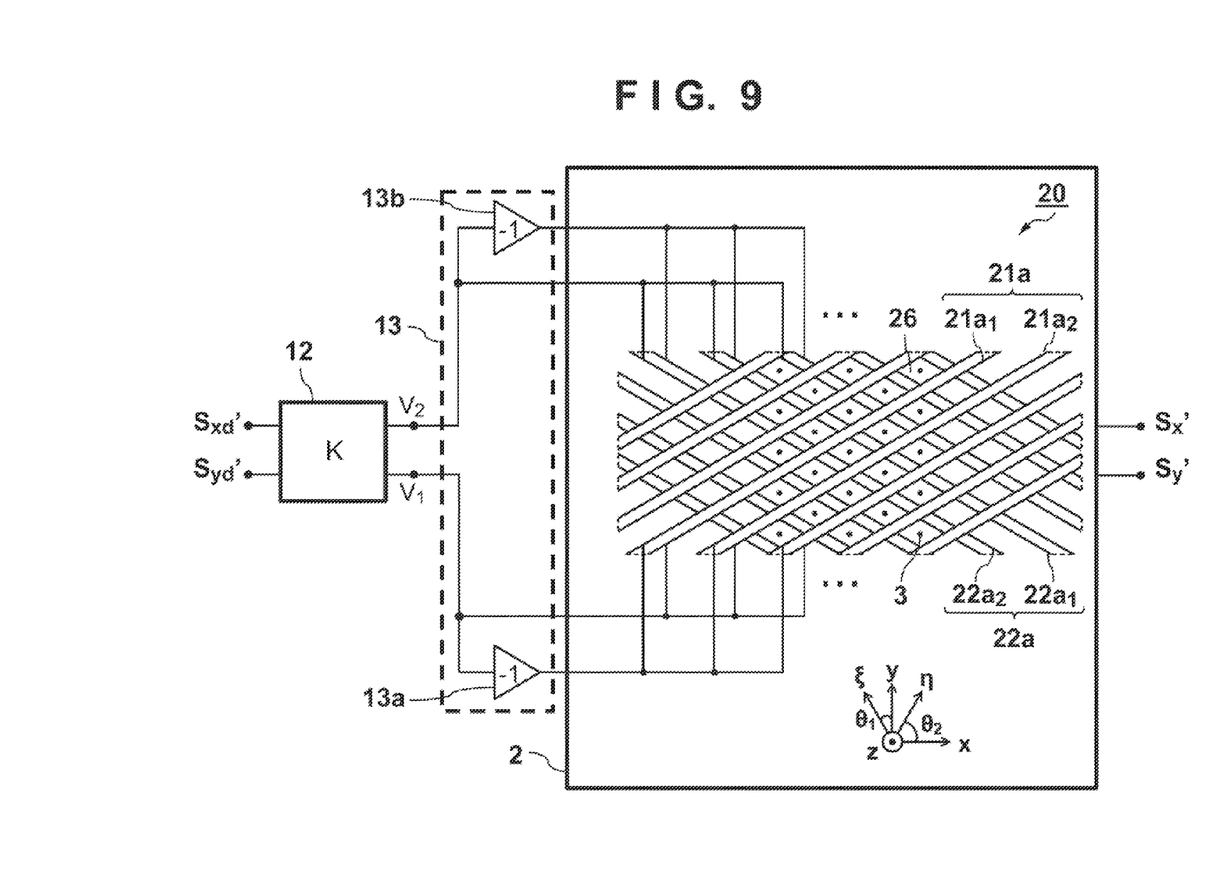
FIG. 9 is a block diagram when a control unit controls the electrostatic deflector.

FIG. 9 is a block diagram in controlling the electrostatic deflector 20. The generation device 12 shown in FIG. 9 determines command values (potentials $V_1$ and $V_2$) supplied to a plurality of first electrode pairs and a plurality of second electrode pairs, based on target deflection angles $S_{xd}'$ and $S_{yd}'$ represented by an orthogonal coordinate system. Then, the control device 13 controls the first electrode pairs and second electrode pairs based on the determined command values (potentials $V_1$ and $V_2$). In, for example, a first electrode pair 21a, a potential +$V_1$ is supplied to one electrode $21a_1$ of a pair of electrodes, while a potential –$V_1$ with a polarity inverted by an inverting circuit 13a in the control device 13 is supplied to the other electrode $21a_2$. Similarly, in a second electrode pair 22a, a potential +$V_2$ is supplied to one electrode $22a_1$ of a pair of electrodes, while a potential –$V_2$ with a polarity inverted by an inverting circuit 13b in the control device 13 is supplied to the other electrode $22a_2$. By supplying potentials to the first electrode pair 21a and second electrode pair 22a in this manner, an electric field $E_1$ in the ξ-direction, and an electric field $E_2$ in the η-direction can be generated in a space 26 through which each charged particle beam 3 passes. Although not shown in FIG. 9, an offset potential $V_0$ may be added to a potential to be supplied to the electrodes $21a_1$ and $21a_2$ in the first electrode pair 21a, and that to be supplied to the electrodes $22a_1$ and $22a_2$ in the second electrode pair 22a.

A matrix K is used in the process by the generation device 12. The numerical value of each element of the matrix K is desirably specified based on the measurement values of target deflection angles $S_{xd}'$ and $S_{yd}'$ in an orthogonal coordinate system, and deflection angles $S_x'$ and $S_y'$ (see FIG. 1) when the charged particle beam 3 is actually deflected. Note that when a candidate value is obtained based on a physical model in specifying the value of each element of the matrix K, it can be used as an initial value in specifying the value of each element of the matrix K. The candidate value based on the physical model can also be used as a value substituted for that of each element of the matrix K when the measurement error at the deflection angle at which the charged particle beam is actually deflected is large. Hence, a method of calculating the candidate value of the matrix K will be described below.

When the above-mentioned physical model represented by equation (8) is extended in the X- and Y-directions, the deflection angles $S_x'$ and $S_y'$ are given by:

$$\begin{bmatrix} S_x'(z, s) \\ S_y'(z, s) \end{bmatrix} = T \cdot G(z, s) \cdot \begin{bmatrix} E_1(s) \\ E_2(s) \end{bmatrix}, \quad (12)$$

$$G(z, s) := \begin{bmatrix} G_1(z, s) & 0 \\ 0 & G_2(z, s) \end{bmatrix},$$

$$T := \begin{bmatrix} T_{1x} & T_{2x} \\ T_{1y} & T_{2y} \end{bmatrix}$$

G is a matrix having, as each element, a transfer function $G_n$ which depends on a height $h_n$ and Z-position of the electrode pair shown in FIG. 4, n is a number, 1 or 2, corresponding to the first electrode member 21 or second electrode member 22, T is a coordinate transformation matrix which performs transformation from an oblique coordinate system (ξ, η) constituted by the ξ-direction in which the charged particles are deflected by the first electrode pairs, and the η-direction in which the charged particles are deflected by the second electrode pairs into an orthogonal coordinate system (x,y) on the substrate surface. For example, a coordinate transformation matrix T is given by:

$$T \approx \begin{bmatrix} -\sin\theta_1 & \cos\theta_2 \\ \cos\theta_1 & \sin\theta_2 \end{bmatrix} \quad (13)$$

where $\theta_1$ is the angle between the Y- and ξ-axes, and $\theta_2$ is the angle between the X- and η-axes.

In, for example, the electrostatic deflector 20 of the first embodiment, since $\theta_1 = \pi/6$ and $\theta_2 = \pi/3$, the coordinate transformation matrix T is given by:

$$T \approx \frac{1}{2} \begin{bmatrix} -1 & 1 \\ \sqrt{3} & \sqrt{3} \end{bmatrix} \quad (14)$$

Also, in the electrostatic deflector 30 of the second embodiment, since $\theta_1 \approx \theta_2 \approx \pi/4$ due to interference of electric fields, a coordinate transformation matrix T is given by:

$$T \approx \frac{1}{2} \begin{bmatrix} -1 & 1 \\ 1 & 1 \end{bmatrix} \quad (15)$$

Note that easiest control for attaining target deflection angles $S_{xd}'$ and $S_{yd}'$ is proportional control. In such proportional control, letting g be the distance between the electrode pairs, as shown in FIG. 4, electric fields $E_{1d}$ and $E_{2d}$ and potentials $V_{1d}$ and $V_{2d}$ applied to the first and second electrode pairs are given by:

$$\begin{bmatrix} E_{1d} \\ E_{2d} \end{bmatrix} = \frac{2}{g} \begin{bmatrix} V_{1d} \\ V_{2d} \end{bmatrix} = G^{-1}(z, 0) \cdot T^{-1} \cdot \begin{bmatrix} S_{xd}' \\ S_{yd}' \end{bmatrix} \quad (16)$$

From the foregoing, the candidate value of the matrix K is given by:

$$K \approx \frac{g}{2} \cdot G^{-1}(z, 0) \cdot T^{-1} \quad (17)$$

As described above, the generation device 12 generates command values to apply electric potential differences to each first electrode pair and each second electrode pair, based on the target deflection angles $S_{xd}'$ and $S_{yd}'$ represented by an orthogonal coordinate system. Also, the control device 13 controls the electrostatic deflector 20 based on the command values generated by the generation device 12. At this time, the charged particle beam 3 which is irradiated on the substrate surface shifts in the X-direction from the principal axis by an amount of deflection $S_{wx}$ proportional to the deflection angle $S_x'$, and shifts in the Y-direction from the principal axis by an amount of deflection $S_{wy}$ proportional to the deflection angle $S_y'$, as shown in FIG. 1. With this operation, the electrostatic deflector 20 can deflect the charged particle beams 3 in the X- and Y-directions.

<Embodiment of Method of Manufacturing Device>

A method of manufacturing a device according to an embodiment of the present invention is suitable for manufacturing various devices including a microdevice such as a semiconductor device and an element having a microstructure. The method of manufacturing a device according to this embodiment includes a step of forming a latent image pattern on a photosensitive agent, applied onto a substrate, using the above-mentioned lithography apparatus (a step of performing writing on a substrate), and a step of developing the substrate having the latent image pattern formed on it in the forming step. This manufacturing method also includes subsequent known steps (for example, oxidation, film formation, vapor deposition, doping, planarization, etching, resist removal, dicing, bonding, and packaging). The method of manufacturing a device according to this embodiment is more advantageous in terms of at least one of the performance, quality, productivity, and manufacturing cost of a device than the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-141465 filed on Jun. 22, 2012, which is hereby incorporated by reference herein in its entirety.

What is claimed is:

1. An electrostatic deflector which deflects a plurality of charged particle beams, the deflector comprising:
   a first electrode member including a plurality of first electrode pairs arranged along a first axis direction in an oblique coordinate system; and
   a second electrode member including a plurality of second electrode pairs arranged along a second axis direction in the oblique coordinate system,
   wherein each of the plurality of charged particle beams is deflected by a corresponding first electrode pair of the plurality of first electrode pairs, and a corresponding second electrode pair of the plurality of second electrode pairs.

2. The deflector according to claim 1, wherein the first electrode member and the second electrode member are spaced apart from each other in a traveling direction of the plurality of charged particle beams incident on the electrostatic deflector.

3. The deflector according to claim 1, wherein the first electrode member and the second electrode member are located to at least partially overlap each other in a traveling direction of the plurality of charged particle beams incident on the electrostatic deflector.

4. The deflector according to claim 1, wherein
the first electrode member includes a supporting member located between the plurality of first electrode pairs and configured to support the plurality of first electrode pairs, and
the second electrode member includes a supporting member located between the plurality of second electrode pairs and configured to support the plurality of second electrode pairs.

5. A lithography apparatus which performs writing on a substrate with a plurality of charged particle beams, the apparatus comprising:
   a charged particle gun for emitting a plurality of charged particle beams; and
   an electrostatic deflector the deflector comprising:
a first electrode member including a plurality of first electrode pairs arranged along a first axis direction in an oblique coordinate system; and
a second electrode member including a plurality of second electrode pairs arranged along a second axis direction in the oblique coordinate system,
wherein each of the plurality of charged particle beams is deflected by a corresponding first electrode pair of the plurality of first electrode pairs, and a corresponding second electrode pair of the plurality of second electrode pairs, wherein the electrostatic deflector is configured to deflect the plurality of charged particle beams.

6. The apparatus according to claim 5, further comprising:
a generation device configured to generate command values for applying electric potential differences to the plurality of first electrode pairs and the plurality of second electrode pairs, based on target positions, of the plurality of charged particle beams on the substrate, represented by an orthogonal coordinate system.

7. A method of manufacturing a device, the method comprising:
performing writing on a substrate using a lithography apparatus;
developing the substrate on which the writing has been performed; and
processing the developed substrate to manufacture the device,
wherein the lithography apparatus performs writing on the substrate with a plurality of charged particle beams,
the apparatus including:
   an electrostatic deflector configured to deflect the plurality of charged particle beams,
the deflector including:
   a first electrode member including a plurality of first electrode pairs arranged along a first axis direction in an oblique coordinate system; and
   a second electrode member including a plurality of second electrode pairs arranged along a second axis direction in the oblique coordinate system,
      wherein each of the plurality of charged particle beams is deflected by a corresponding first electrode pair of the plurality of first electrode pairs, and a corresponding second electrode pair of the plurality of second electrode pairs.

* * * * *